United States Patent
Wheless, Jr. et al.

(10) Patent No.: US 7,107,362 B2
(45) Date of Patent: Sep. 12, 2006

(54) INTEGRATED CIRCUIT WITH CONFIGURATION BASED ON PARAMETER MEASUREMENT

(75) Inventors: Thomas Omega Wheless, Jr., Eagle, ID (US); Richard David Taylor, Eagle, ID (US); Douglas Gene Keithley, Boise, ID (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 171 days.

(21) Appl. No.: 10/440,634

(22) Filed: May 19, 2003

(65) Prior Publication Data

US 2004/0236534 A1 Nov. 25, 2004

(51) Int. Cl.
*G06F 13/00* (2006.01)

(52) U.S. Cl. .............................. 710/10; 710/22; 710/19; 714/733; 714/734; 713/1

(58) Field of Classification Search ............ 710/10–19, 710/22–28, 48, 260, 313; 714/724, 726, 733–734; 712/229; 702/57, 116, 120; 713/1
See application file for complete search history.

(56) References Cited

U.S. PATENT DOCUMENTS

| | | | | |
|---|---|---|---|---|
| 5,197,016 A | * | 3/1993 | Sugimoto et al. | 716/8 |
| 5,613,129 A | * | 3/1997 | Walsh | 710/267 |
| 5,727,208 A | | 3/1998 | Brown | |
| 6,006,022 A | * | 12/1999 | Rhim et al. | 716/1 |
| 6,061,711 A | * | 5/2000 | Song et al. | 718/108 |
| 6,122,131 A | | 9/2000 | Jeppson | |
| 6,275,782 B1 | | 8/2001 | Mann | |
| 6,298,454 B1 | | 10/2001 | Schleiss et al. | |
| 6,415,243 B1 | | 7/2002 | Mann | |
| 6,457,090 B1 | * | 9/2002 | Young | 710/313 |
| 6,480,809 B1 | | 11/2002 | Slaight | |
| 6,694,492 B1 | * | 2/2004 | Shakkarwar | 716/2 |
| 6,798,418 B1 | * | 9/2004 | Sartori et al. | 345/519 |
| 6,813,689 B1 | * | 11/2004 | Baxter, III | 711/114 |
| 2003/0024320 A1 | | 2/2003 | Bentley | |

* cited by examiner

*Primary Examiner*—Christopher B. Shin

(57) ABSTRACT

Embodiments of the present invention provide an integrated circuit. In one embodiment, the integrated circuit comprises logic blocks, a measurement circuit and a control circuit. The measurement circuit is configured to measure operating parameters of the integrated circuit and the logic blocks and provide operating parameter data. The control circuit is configured to receive the operating parameter data, evaluate the operating parameter data to obtain configuration data and configure the integrated circuit with the configuration data.

20 Claims, 4 Drawing Sheets

INTEGRATED CIRCUIT WITH CONFIGURATION BASED ON PARAMETER MEASUREMENT

THE FIELD OF THE INVENTION

The present invention relates generally to integrated circuits, and more particularly to measuring internal operating parameters of integrated circuits and configuring the circuits to change system operation.

BACKGROUND OF THE INVENTION

Integrated circuits operate in systems, which perform larger system functions. Some integrated circuits, referred to as application specific integrated circuits (ASICs), operate in only one type of system or application. The ASIC performs functions derived from the larger system functions of the application. An ASIC can include analog and digital circuits to perform the ASIC functions. The analog and digital circuits can be arranged as one or more independent functional blocks, a system-on-a-chip or a combination of independent functional blocks and a system-on-a-chip. Typically, a system-on-a-chip includes a core processor, memory, and peripheral logic blocks and storage elements.

Sometimes ASICs are used in different systems that perform similar functions. The different systems differ in a number of ways including system size and system performance characteristics, such as quality and speed. In addition, the systems can range in complexity from very simple single function systems to more complex multiple function systems. Usually, the larger, higher performance and more complex systems use more resources of the ASIC, as compared to the smaller, lower performance and simpler systems.

Different systems and functions in a multiple function system use ASIC resources differently. Using resources differently can result in one ASIC configuration performing fine in one system, yet not performing well in another system. Also, using resources differently can result in one ASIC configuration performing very well during one function of a multiple function system, but not performing well during another function of the multiple function system.

The ASIC can be configured for each system and function to offer a system with improved performance. To determine configuration settings for the ASIC, the performance of each system is analyzed with the ASIC installed and while each function is performed. Performance can be analyzed by observing system performance and internal operating parameters of the ASIC. In one process, an arbitrary ASIC configuration is set in the ASIC and system performance is measured. Educated guesses are used to change the ASIC configuration and system performance is measured again. This process continues until developers are satisfied with system performance for each system and function. To obtain ASIC internal operating parameters, the ASIC must be probed during operation, which can be a very difficult and time consuming task. Obtaining system performance data and ASIC operating parameter data, and configuring the ASIC for each and every system and function can be a difficult and time consuming task that rivals the design of the ASIC and increases the cost of the ASIC and system. The increased cost can make the ASIC and system cost prohibitive for the market.

SUMMARY OF THE INVENTION

Embodiments of the present invention provide an integrated circuit. In one embodiment, the integrated circuit comprises logic blocks, a measurement circuit and a control circuit. The measurement circuit is configured to measure operating parameters of the integrated circuit and the logic blocks and provide operating parameter data. The control circuit is configured to receive the operating parameter data, evaluate the operating parameter data to obtain configuration data and configure the integrated circuit with the configuration data.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
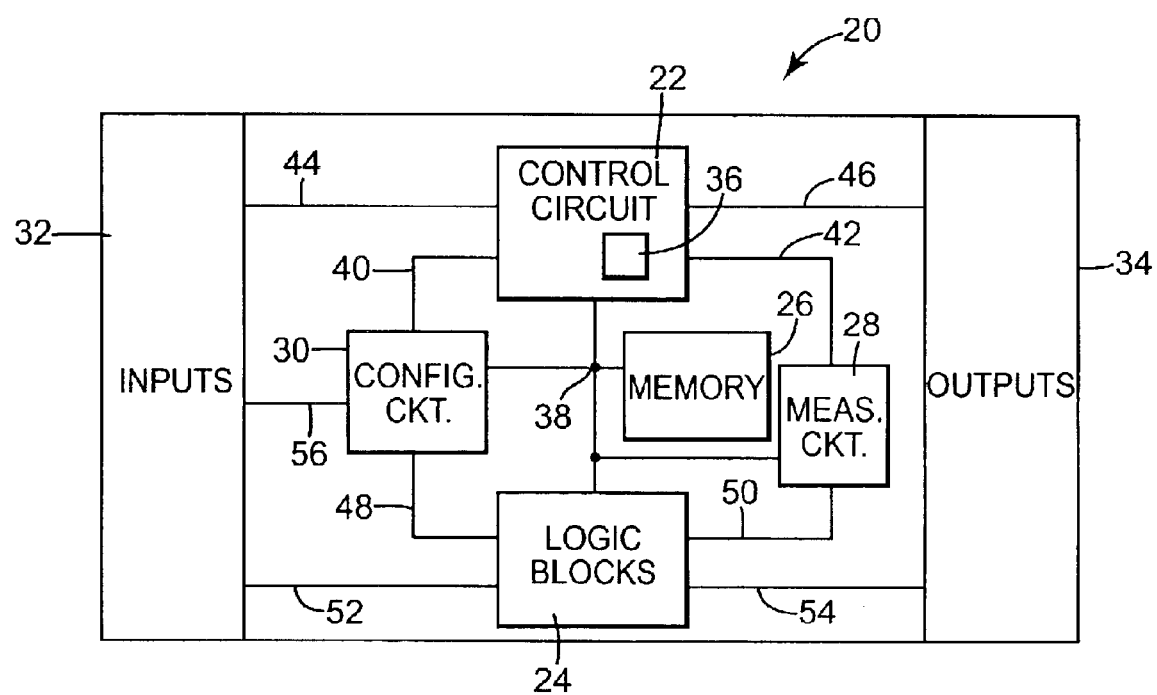
FIG. 1 is a diagram illustrating an exemplary embodiment of an integrated circuit, according to the present invention.

FIG. 1 is a diagram illustrating an exemplary embodiment of an integrated circuit 20, according to the present invention. The integrated circuit 20 is an ASIC for systems that perform one or more system functions such as scanning, copying, faxing and printing. Systems that perform multiple functions are referred to as multiple function peripheral (MFP) products. In other embodiments, the integrated circuit 20 is an ASIC for systems that perform any other suitable function(s).

The integrated circuit 20 controls peripheral devices to perform system functions. The peripheral devices can include a motor, a fuser and a cold cathode florescent lamp (CCFL). The motor provides movement for document scanning and paper moving mechanisms. The fuser provides heat to bind toner to paper and the CCFL provides light for scanning documents. Only a limited number and certain types of peripheral devices are described to simplify the description. In practice, any suitable number and other suitable types of peripheral devices can be included as part of the system.

In the exemplary embodiment, the integrated circuit 20 measures internal operating parameters and provides operating parameter data for configuring the integrated circuit 20. The integrated circuit 20 is configured to alter the performance of the integrated circuit 20 in a system. The integrated circuit 20 can be configured automatically by internal circuits or manually through external inputs.

The integrated circuit 20 can be used in a variety of systems. The systems may differ based on criteria such as performance characteristics including speed and quality, the number and type of functions performed, the number and type of peripherals and the quality of the peripherals. In addition, system usage may differ based on the end user installation. The integrated circuit 20 is used in each of these systems and installations. However, one configuration of integrated circuit 20, such as one configuration of interrupt priority levels, may not perform well in every system and installation. The integrated circuit 20 includes measurement and configuration circuits to alter the configuration of the integrated circuit 20 to improve its performance in the various systems and installations.

The integrated circuit 20 includes a control circuit 22, logic blocks 24, memory 26, a measurement circuit 28, a configuration circuit 30, external inputs 32 and external outputs 34. In the exemplary embodiment, the control circuit 22 is a core processor including non-volatile memory 36. The core processor can be a general-purpose microprocessor or a controller. In other embodiments, control circuit 22 can be logic gates arranged to perform the ASIC functions. The non-volatile memory 36 is any suitable non-volatile memory, such as electrically erasable programmable read only memory (EEPROM).

Control circuit 22 is electrically coupled to the logic blocks 24, memory 26 and configuration circuit 30 through a system bus, indicated at 38. The system bus 38 includes address paths, data paths and miscellaneous signal paths. The system bus 38 can also include control logic, such as a backplane controller and backplane configuration logic. Control circuit 22 is electrically coupled to configuration circuit 30 through interrupt/data path 40 and to measurement circuit 28 through measurement/data path 42. In addition, control circuit 22 is electrically coupled to inputs 32 through input path 44 and outputs 34 through output path 46.

The logic blocks 24 include digital and analog circuits for performing functions of the integrated circuit 20. The logic blocks 24 are electrically coupled to system bus 38 for communicating with other logic blocks 24 and the control circuit 22, memory 26 and configuration circuit 30. The logic blocks 24 are also electrically coupled to configuration circuit 30 through request path 48 and to measurement circuit 28 through measurement path 50. In addition, logic blocks 24 are electrically coupled to inputs 32 through logic block input path 52 and outputs 34 through logic block output path 54.

The memory 26 is random access memory (RAM), such as static random access memory (SRAM), dynamic random access memory (DRAM) or another suitable memory type. Memory 26 is electrically coupled to system bus 38 for communicating with control circuit 22, logic blocks 24 and configuration circuit 30. In the exemplary embodiment, memory 26 is divided into different functional blocks. One part of memory 26 can be used for direct memory access (DMA) transfers, another part for a first-in-first-out (FIFO) memory and another part for temporary storage and scratch pad storage by control circuit 22. In other embodiments, memory 26 can be divided into other suitable functional areas.

The measurement circuit 28 includes measurement devices for measuring operating parameters of the integrated circuit 20 and the logic blocks 24. The operating parameters measured include data transfer rate parameters, such as interrupt latency, bandwidth, bus hold off time and continuous address accesses in a memory. The bus hold off time is also referred to as data transfer latency. In the exemplary embodiment, measurement circuit 28 includes gated counters as measurement devices for measuring operating parameters. The measurement devices are electrically coupled to the logic blocks 24 through measurement path 50 and to control circuit 22 through measurement/data path 42. Also, a measurement device is electrically coupled to system bus 38. In one embodiment, a measurement device is electrically coupled to interrupt/data path 40.

The configuration circuit 30 includes a configurable logic circuit for altering the performance of the integrated circuit 20 in the system. The configuration circuit 30 is electrically coupled to system bus 38 for communicating with control circuit 22, the logic blocks 24 and memory 26. Also, configuration circuit 30 is electrically coupled to control circuit 22 through interrupt/data path 40 and to the logic blocks 24 through request path 48. In addition, configuration circuit 30 is electrically coupled to inputs 32 through configuration circuit input path 56.

In the exemplary embodiment, configuration circuit 30 is an interrupt controller. The interrupt controller receives interrupt requests from the logic blocks 24 and arranges the interrupt requests according to priority levels programmed into the interrupt controller. The priority levels are pro-grammed into the interrupt controller by control circuit 24 or through inputs 32. In another embodiment, the configuration circuit is a DMA controller and a configurable logic circuit. The configurable logic circuit receives DMA requests from the logic blocks 24 and arranges the DMA requests according to an arbitration scheme, also referred to as an arbitration method. The arbitration scheme arranges the received DMA requests into order for processing. In one arbitration scheme, the DMA requests are ordered according to priority levels. The priority levels for the DMA requests are programmed into the configurable logic circuit. In other arbitration schemes, the priority levels are set according to a dynamic priority level pattern, such as a round robin pattern or a random pattern. In the round robin pattern, the DMA request most recently processed is set to the lowest priority level. A dynamic priority level pattern is selected by programming the DMA configurable logic circuit.

In another embodiment, the system bus 38, includes a backplane controller and backplane configuration logic. The backplane controller and the backplane configuration logic operate as a configuration circuit. The backplane controller controls traffic on the system bus 38, including traffic such as DMA transfers between logic blocks and other data transfers. The backplane configuration logic receives data transfer requests and arbitrates the requests in an arbitration scheme. The arbitration scheme can be any suitable arbitration scheme, including programmed priority levels and dynamic priority level schemes, such as round robin and random schemes. In other embodiments, the configuration circuit is a clock circuit, which can be configured to adjust the clock speed. In other embodiments, control circuit 22 and other suitable circuits are used to alter the bus protocol of system bus 38.

The inputs 32 and outputs 34 include analog and digital circuits for communicating with circuits outside the integrated circuit 20. In the exemplary system, the external circuits include the motor, fuser and CCFL for performing the scanning, copying, faxing and printing functions. The inputs 32 and outputs 34 communicate at predetermined logic levels, such as complimentary metal oxide semiconductor (CMOS) levels and transistor-transistor logic (TTL) levels. The inputs 32 are electrically coupled to control circuit 22, the logic blocks 24 and configuration circuit 30. The outputs are electrically coupled to control circuit 22 and the logic blocks 24.

Control circuit 22 controls operation of integrated circuit 20 to perform system functions and alter the performance of integrated circuit 20. Control circuit 22 includes a memory controller for controlling memory operations. In one operation of the exemplary embodiment, control circuit 22 controls measurement circuit 28 to gather operating parameter data from integrated circuit 20 and provide the operating parameter data to control circuit 22. The control circuit 22 receives the operating parameter data from measurement circuit 28 and evaluates the received operating parameter data against predetermined criteria, such as increasing data rate transfers and meeting bandwidth needs. Control circuit 22 automatically determines updated configuration data from the operating parameter data and configures configuration circuit 30 with the updated configuration data to alter and improve the performance of integrated circuit 20 in the system. Control circuit 22 stores the updated configuration data in non-volatile memory 36.

In another operation of the exemplary embodiment, referred to as manual operation, integrated circuit 20 provides operating parameter data to external circuitry and receives updated configuration data from external circuitry. Control circuit 22 controls measurement circuit 28 to gather operating parameter data from integrated circuit 20 and provide the operating parameter data to control circuit 22. The control circuit 22 receives the operating parameter data from measurement circuit 28 and provides the operating parameter data to external circuitry through outputs 34. The operating parameter data is evaluated outside integrated circuit 20 and the external circuitry provides updated configuration data to configuration circuit 30 and control circuit 22. The external circuitry provides the updated configuration data to configuration circuit 30 through inputs 32 and configuration circuit input path 56. The external circuitry also provides the updated configuration data to control circuit 22 through inputs 32 and input path 44. Control circuit 22 stores the updated configuration data in non-volatile memory 36. In manual operation, the external circuitry can be an external test system, which evaluates the received operating parameter data to obtain updated configuration data. The test system then loads the updated configuration data into integrated circuit 20 through inputs 32.

In another embodiment, control circuit 22 provides automatic and manual operation. However, during manual operation, external circuitry only provides the updated configuration data to control circuit 22 through inputs 32 and input path 44. The external circuitry does not provide the updated configuration data to configuration circuit 30 through inputs 32 and configuration circuit input path 56. Instead, control circuit 22 programs configuration circuit 30 and stores the updated configuration data in non-volatile memory 36.

In another embodiment, control circuit 22 does not provide automatic operation. Instead, only manual operation is provided. Control circuit 22 controls measurement circuit 28 to measure operating parameter data and provide the operating parameter data to control circuit 22. The control circuit 22 provides the operating parameter data to external circuitry, such as a test system, through outputs 34. The control circuit 22 receives updated configuration data from the external circuitry through inputs 32 and input path 44. The control circuit 22 programs configuration circuit 30 and stores the updated configuration data in non-volatile memory 36.

In the exemplary embodiment, non-volatile memory 36 is initially programmed with default configuration data before the system and integrated circuit 20 are powered up for the first time. The default configuration data can be obtained in an iterative process using manual operation at prototyping and testing of integrated circuit 20 in a selected system. An initial set of configuration data is loaded into configuration circuit 30. Control circuit 22 stores the initial set of configuration data in non-volatile memory 36. Control circuit 22 controls measurement circuit 28 to take measurements of operating parameters in integrated circuit 20 and provide operating parameter data to control circuit 22. Control circuit 22 receives the operating parameter data and provides the operating parameter data to outputs 34 and external circuitry. The operating parameter data is evaluated externally and updated configuration data is provided to inputs 32, control circuit 22 and configuration circuit 30. The system operates to perform system functions and, in manual operation, integrated circuit 20 provides operating parameter data and receives updated configuration data. This process continues until system performance meets or exceeds predetermined criteria for the system and each function performed by the system. Control circuit 22 programs non-volatile memory 36 with the updated configuration data as default configuration data for the system.

During automatic operation of the exemplary embodiment, control circuit 22 retrieves the configuration data from non-volatile memory 36 at system boot-up. Control circuit 22 programs configuration circuit 30 with the retrieved configuration data and controls system operation to perform system functions. While performing system functions, control circuit 22 controls measurement circuit 28 to measure operating parameters and obtain operating parameter data. The control circuit 22 receives the operating parameter data from measurement circuit 28 and evaluates the operating parameter data to obtain updated configuration data. Control circuit 22 programs configuration circuit 30 with the updated configuration data to improve performance of integrated circuit 20 and the system. The control circuit 22 stores the updated configuration data in non-volatile memory 36. In one embodiment, one set of configuration data is stored for the entire system, including all system functions. In another embodiment, in a system such as an MFP product, one set of configuration data is stored for each system function. To perform a system function, control circuit 22 programs configuration circuit 30 with the set of configuration data corresponding to the system function.

In another operation of the exemplary embodiment, integrated circuit 20 can be instructed to automatically update configuration data. Control circuit 22 controls measurement circuit 28 to measure operating parameters and obtain operating parameter data. Control circuit 22 evaluates the operating parameter data and automatically programs configuration circuit 30. In one situation, an end user initiates automatic updating of configuration data through a user interface, such as a keypad. In another situation, automatic updating of configuration data is done each time a change is made to the system, such as by adding or removing a peripheral.

In manual operation of the exemplary embodiment, integrated circuit 20 is instructed to provide operating parameter data and receive updated configuration data. The user initiates manual operation through a user interface, such as a keypad. Control circuit 22 controls measurement circuit 28 to measure operating parameters and provide the operating parameter data to control circuit 22. The operating parameter data is obtained while the system performs system functions. Control circuit 22 provides the operating parameter data through outputs 34 to external circuitry. The external circuitry evaluates the operating parameter data to obtain updated configuration data, which is programmed into configuration circuit 30 through inputs 32. Manual operation can be repeated for each system function to obtain one set of configuration data for the entire system or one set of configuration data for each system function. In the embodiment, which does not include automatic operation, manual operation is performed to obtain operating parameter data and update configuration data.

Figure 2:
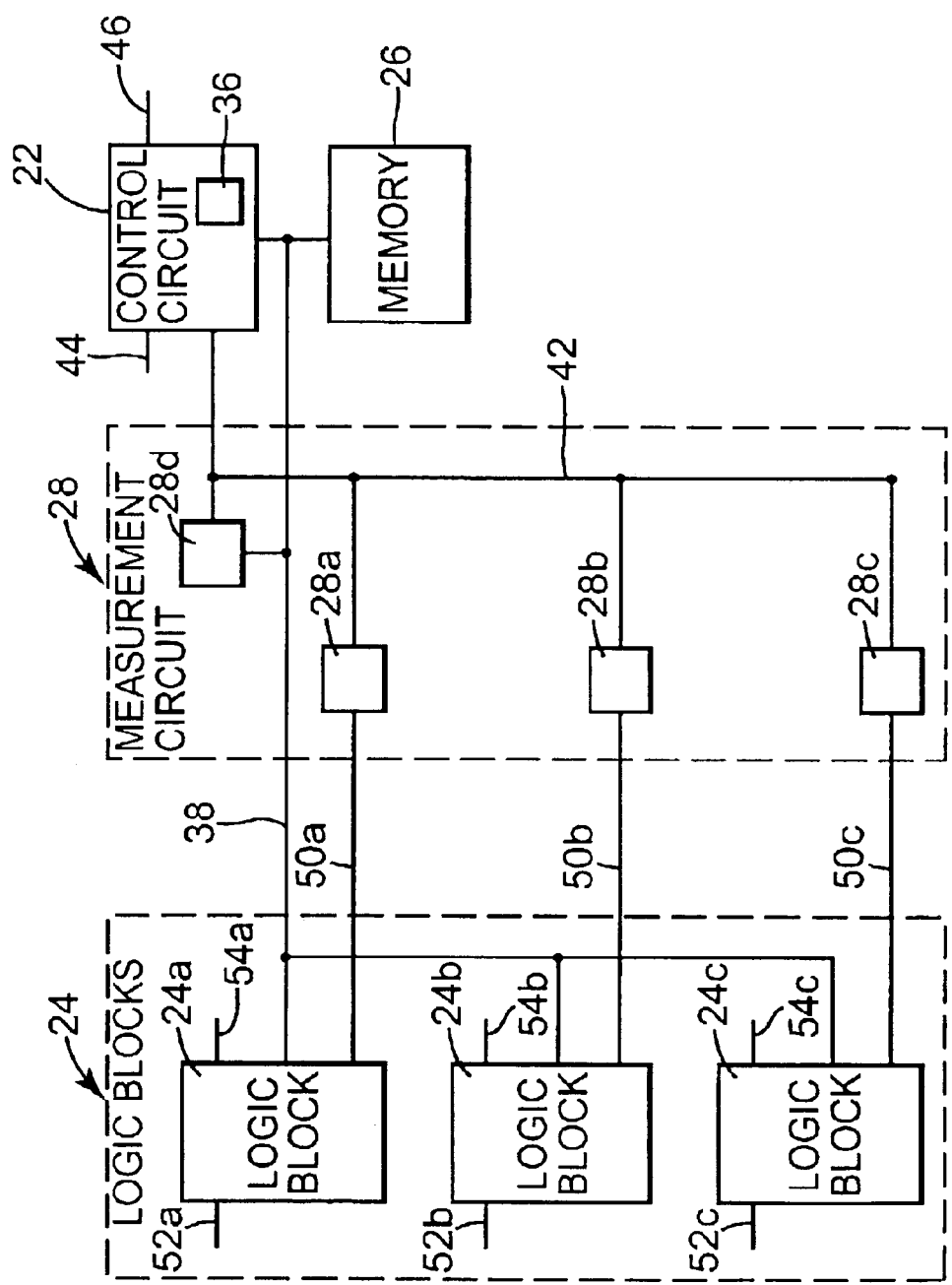
FIG. 2 is a diagram illustrating an exemplary embodiment of a measurement circuit and logic blocks coupled to a control circuit and memory in an integrated circuit.

FIG. 2 is a diagram illustrating an exemplary embodiment of measurement circuit 28 and the logic blocks 24 coupled to control circuit 22 and memory 26 in integrated circuit 20. The measurement circuit 28 includes measurement devices 28a–28d. The logic blocks, indicated at 24, include logic blocks 24a–24c.

In the exemplary embodiment, measurement devices 28a–28d are gated counters that measure operating parameters. The measurement devices 28a–28d are controlled by control circuit 22 to accumulate a count during a gated period. The measurement devices 28a–28d provide the accumulated count to control circuit 22 after the gated period.

In another embodiment, the measurement devices are included as part of the system bus 38, where the system bus 38 is configured as a backplane controller and backplane configuration logic. The system bus measurement devices gather measurement data form the system bus 38 and bus traffic. The measured data is provided to a control circuit, such as control circuit 22 or the backplane controller, for evaluation and configuring the integrated circuit.

In the exemplary embodiment, the measurement devices 28a–28d are electrically coupled to logic blocks 24a–24c, control circuit 22 and system bus 38. Measurement device 28a is electrically coupled to logic block 24a through measurement path 50a and to control circuit 22 through measurement/data path 42. Measurement device 28b is electrically coupled to logic block 24b through measurement path 50b and to control circuit 22 through measurement/data path 42. Measurement device 28c is electrically coupled to logic block 24c through measurement path 50c and to control circuit 22 through measurement/data path 42. In addition, measurement device 28d is electrically coupled to control circuit 22 through measurement data/path 42 and to system bus 38. The system bus 38 is also electrically coupled to logic blocks 24a–24c, control circuit 22 and memory 26.

The logic blocks 24a–24c are electrically coupled to measurement devices 28a–28c, inputs 32, outputs 34 and system bus 38. In addition, logic blocks 24a–24c are electrically coupled to configuration circuit 30 through request path 48. Logic blocks 24a–24c are electrically coupled to measurement devices 28a–28c through measurement paths 50a–50c. Logic block 24a is electrically coupled to inputs 32 through logic block input path 52a and to outputs 34 through logic block output path 54a. Logic block 24b is electrically coupled to inputs 32 through logic block input path 52b and to outputs 34 through logic block output path 54b. Logic block 24c is electrically coupled to inputs 32 through logic block input path 52c and to outputs 34 through logic block output path 54c.

Control circuit 22 is electrically coupled to inputs 32, outputs 34, measurement/data path 42 and system bus 38. Control circuit 22 is electrically coupled to inputs 32 through input path 44 and to outputs 34 through output path 46. In addition, control circuit 22 is electrically coupled to configuration circuit 30 through interrupt path 40. The control circuit 22 includes non-volatile memory 36 and is coupled to memory 26, which is electrically coupled to system bus 38.

Only a relatively small number of measurement devices 28a–28d and logic blocks 24a–24c are shown to simplify the illustration. In practice, any suitable number of measurement devices and logic blocks can be used in integrated circuit 20. In other embodiments, the measurement devices can be used anywhere in the integrated circuit and logic blocks can be electrically coupled to more than one measurement device or no measurement device.

In the exemplary embodiment, measurement devices 28a–28d are gated counters. Each gated counter measurement device 28a–28d includes gating logic and a counter. The gating logic receives signals from control circuit 22 and items, such as logic blocks 24a–24c and system bus 38. The gating logic provides operating parameter data in the form of a resulting count value to control circuit 22.

In one type of measurement, the gating logic receives a signal(s) to indicate an operating parameter event has occurred. The gating logic clocks the counter to increment the count each time an event occurs. The resulting count at the end of a gated period is the operating parameter data. The gated period is set by an arbitrary measure, such as a time period or an operational unit. In another type of measurement, the gating logic receives a continuous clock signal and the gating logic gates the clock signal to the counter to increment the counter during the gated period. The gated period is based on operating parameter events and controlled by the gating logic and/or control circuit 22. In any type of measurement, control circuit 22 controls a selected measurement device 28a–28d to provide the resulting count as the operating parameter data to control circuit 22.

A measurement device 28a–28d is gated based on the type of measurement and the operating parameter measured. Where the measurement device 28a–28d is counting events, control circuit 22 controls the length of the gated period based on criteria, such as a time period as measured by a timer or an operational unit. In the exemplary embodiment, operational units include scanning one page, copying a page and printing a page. Operational units also include smaller sections of data, such as several scan lines and only a few lines of the printed page. Where the measurement device 28a–28d is measuring a length of time, the length of the gated period is determined by the measured operating parameter, such as the time between an interrupt and control circuit 22 responding to the interrupt. During this gated period, the clock signal increments the counter to obtain the control circuit 22 response time.

In one operating parameter measurement, referred to as an interrupt latency measurement, the gated period is the time between the issuance of an interrupt and control circuit 22 responding to the interrupt. For example, a logic block 24a–24c provides a signal to a measurement device 28a–28d to indicate an interrupt is being issued and to begin the gated period. The measurement device 28a–28d receives the signal, resets the counter and starts incrementing the counter with the clock signal. As control circuit 22 responds to the interrupt, control circuit 22 signals the measurement device 28a–28d to stop counting. The control circuit 22 instructs the measurement device 28a–28d to provide the latest interrupt latency count to control circuit 22. In other embodiments, an average interrupt latency count over a fixed number of measurements, such as four or five measurements, can be provided to control circuit 22. In any case, control circuit 22 receives the interrupt latency count for evaluation.

In another operating parameter measurement, referred to herein as a DMA request latency measurement, the gated period is the time between the issuance of a DMA request and the DMA request being granted. For example, a logic block 24a–24c provides a signal to a measurement device 28a–28d to indicate a DMA request is being issued and to begin the gated period. The measurement device 28a–28d receives the signal, resets the counter and starts incrementing the counter with the clock signal. As the DMA controller responds to the DMA request, the logic block 24a–24c signals the measurement device 28a–28d to stop counting. The control circuit 22 instructs the measurement device 28a–28d to provide the latest DMA request latency count to control circuit 22. In other embodiments, an average DMA request latency count over a fixed number of measurements, such as four or five measurements, can be provided to control circuit 22. In any case, control circuit 22 receives the DMA request latency count for evaluation.

In another operating parameter measurement, referred to as a bus hold off time measurement, the gated period is the time between receiving data for processing. For example, each time a logic block 24a–24c receives data for processing, the logic block 24a–24c signals the gated counter measurement device 28a–28d to store the present count, reset the counter and begin incrementing the counter with the clock signal. Control circuit 22 instructs the measurement device 28a–28d to provide the latest stored bus hold off time count value to control circuit 22. In other embodiments, an average bus hold off time over a fixed number of measurements, such as four or five measurements, can be provided to control circuit 22. In any case, control circuit 22 receives the bus hold off time count value for evaluation.

In the exemplary embodiment, measurement device 28a is a gated counter coupled to logic block 24a to measure the signal traffic into and out of logic block 24a, referred to as the bandwidth of logic block 24a. The logic block 24a provides a signal to measurement device 28a each time bus traffic goes into or out of logic block 24a. At the beginning of a gated period, measurement device 28a resets the counter. During the gated period, measurement device 28a receives event signals and increments the counter to accumulate operating parameter data on the bandwidth of logic block 24a. The gated period of measurement device 28a is controlled by control circuit 22. In the exemplary embodiment, control circuit 22 uses a timer to begin and end the gated period. In other embodiments, the gated period can be controlled based on operational units.

Measurement device 28b is a gated counter coupled to logic block 24b to measure the interrupt latency of logic block 24b. The logic block 24b issues an interrupt to control circuit 22 through configuration circuit 30 and an interrupt event signal to measurement device 28b. The measurement device 28b receives the interrupt event signal, resets the counter and begins incrementing the counter with a continuous clock signal. Control circuit 22 receives the interrupt and responds to the interrupt. As control circuit 22 responds to the interrupt, it provides an interrupt response event signal to measurement device 28b, which receives the response event signal and stops incrementing the counter. Measurement device 28b provides the resulting count as an interrupt latency count value to control circuit 22.

In another embodiment, measurement device 28b is a gated counter coupled to logic block 24b to measure the DMA request latency of logic block 24b. The logic block 24b issues a DMA request through the configuration circuit and a DMA request event signal to measurement device 28b. The measurement device 28b receives the DMA request event signal, resets the counter and begins incrementing the counter with a continuous clock signal. Eventually, the DMA request is granted and acted upon. The logic block 24b provides a DMA request granted event signal to measurement device 28b. The measurement device 28b receives the granted event signal and stops incrementing the counter. Measurement device 28b provides the resulting count as a DMA request latency count value to control circuit 22.

Measurement device 28c is a gated counter coupled to logic block 24c to measure the bus hold off time of logic block 24c. The bus hold off time is how long a functional block has been starved for data or, in other words, how long it has been since the logic block 24c has received data for processing. Logic block 24c provides an event signal to measurement device 28c each time the logic block 24c receives data for processing. In response to the event signal, measurement device 28c stores the count value, resets the counter and begins incrementing the counter with the continuous clock signal. To retrieve bus hold off time operating parameter data from measurement device 28c, control circuit 22 instructs the measurement device 28c to provide the latest bus hold off time stored count value, to control circuit 22. In other embodiments, measurement device 28 can provide an average bus hold off time over a fixed number of measurements, such as four or five measurements.

Measurement device 28d is a gated counter coupled to system bus 38 to measure all bus traffic on system bus 38, referred to as the bandwidth of system bus 38. The gating logic of measurement device 28d picks up start and stop bit patterns on system bus 38 and increments the counter each time a set of start and stop bit patterns is detected. The counter value is the operating parameter data referred to as the bandwidth of system bus 38. The gated period of measurement device 28d is controlled by control circuit 22. In the exemplary embodiment, control circuit 22 uses a timer to set the length of the gated period. In other embodiments, the gated period can be controlled based on operational units, such as scanning, copying or printing one page.

In automatic operation of the exemplary embodiment, control circuit 22 receives operating parameter data from measurement devices 28a–28d, evaluates the operating parameter data and programs updated configuration data into configuration circuit 30. The updated configuration data is stored in non-volatile memory 36. In manual operation, control circuit 22 provides the operating parameter data to outputs 34 through output path 46. External circuitry, such as a test system, receives the operating parameter data, which is evaluated to obtain updated configuration data. The updated configuration data is provided to configuration circuit 30 and control circuit 22 through inputs 32. The control circuit 22 stores the updated configuration data in non-volatile memory 36.

In another embodiment, control circuit 22 provides the operating parameter data to outputs 34 and external circuitry for evaluation. The external circuitry evaluates the operating parameter data to obtain updated configuration data. The updated configuration data is provided to control circuit 22 through inputs 32. The control circuit 22 programs configuration circuit 30 and stores the updated configuration data in non-volatile memory 36. In this embodiment, control circuit 22 is not configured to automatically evaluate the operating parameter data and provide updated configuration data.

Figure 3:
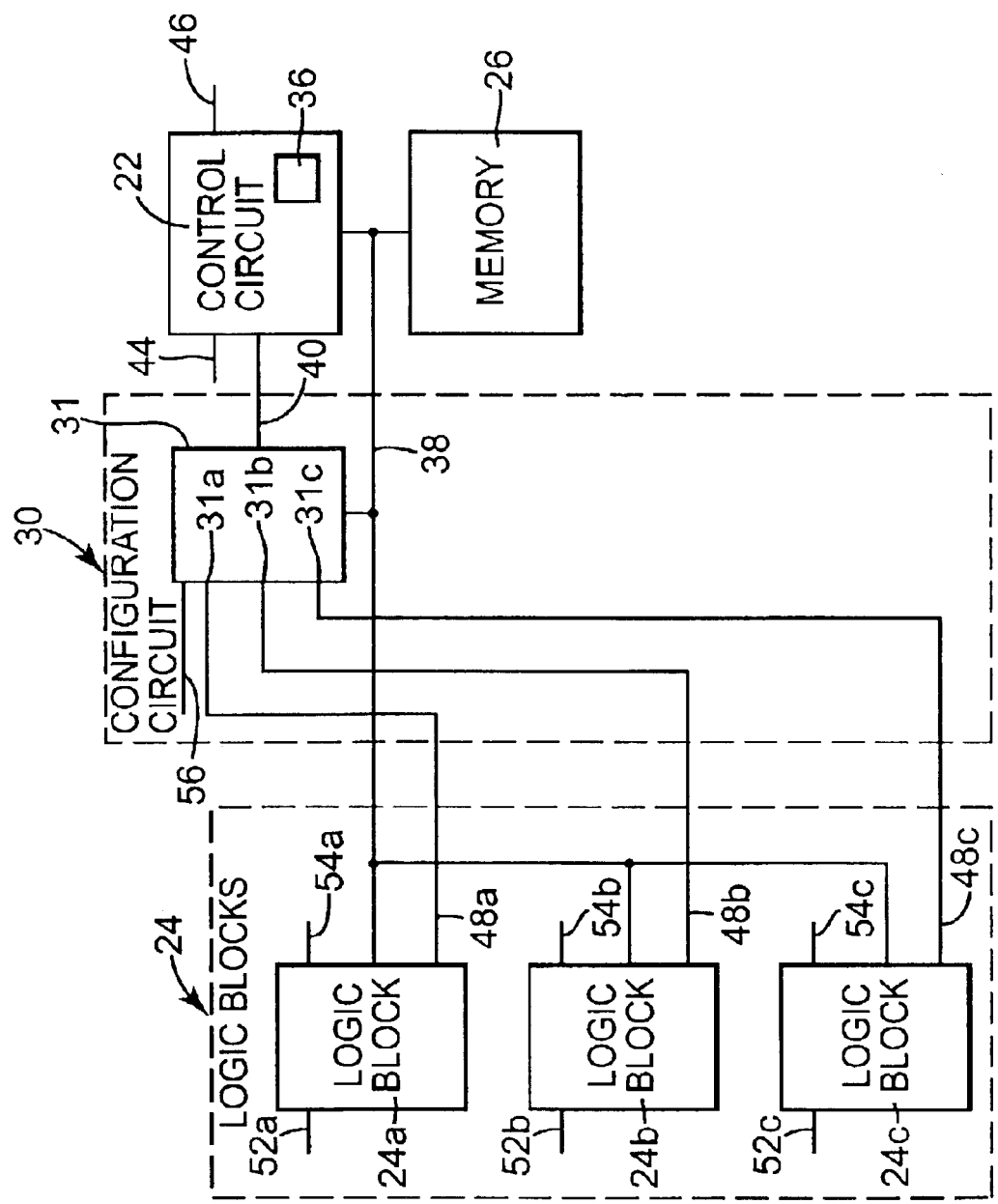
FIG. 3 is a diagram illustrating an exemplary embodiment of a configuration circuit and logic blocks coupled to a control circuit and memory in an integrated circuit.

FIG. 3 is a diagram illustrating an exemplary embodiment of a configuration circuit 30 and the logic blocks 24 coupled to control circuit 22 and memory 26 in integrated circuit 20. The configuration circuit 30 includes an interrupt controller 31 and the logic blocks, indicated at 24, include logic blocks 24a–24c.

The interrupt controller 31 receives interrupts from logic blocks 24a–24c. The interrupt controller 31 prioritizes the interrupts according to an arbitration scheme. In the exemplary embodiment, interrupt priority levels are programmed into the interrupt controller 31. The interrupt controller 31 passes on the highest priority level interrupt to control circuit 22. The control circuit 22 responds to the interrupt in an interrupt routine. The interrupt priority levels are programmed with configuration data provided by control circuit 22 or external circuitry through inputs 32.

The interrupt controller 31 is electrically coupled to the logic blocks 24, control circuit 22, inputs 32 and system bus 38. Interrupt controller 31 is electrically coupled to logic block 24a through request path 48a, logic block 24b through request path 48b and logic block 24c through request path 48c. Each request path 48a–48c is electrically coupled to a corresponding interrupt request input 31a–31c on interrupt controller 31. The interrupt controller 31 receives interrupts from logic blocks 24a–24c through request paths 48a–48c and interrupt request inputs 31a–31c. The interrupt controller 31 is electrically coupled to control circuit 22 through interrupt/data path 40 and to inputs 32 through configuration circuit input path 56.

The logic blocks 24a–24c are electrically coupled to interrupt controller 31, inputs 32, outputs 34 and system bus 38. In addition, each logic block 24a–24c is electrically coupled to measurement circuit 28 through measurement path 50. Logic block 24a is electrically coupled to interrupt request input 31a through request path 48a. Logic block 24a is electrically coupled to inputs 32 through logic block input path 52a and to outputs 34 through logic block output path 54a. In addition, logic block 24a is electrically coupled to system bus 38. Logic block 24b is electrically coupled to interrupt request input 31b through request path 48b. Logic block 24b is electrically coupled to inputs 32 through logic block input path 52b and to output 34 through logic block output path 54b. In addition, logic block 24b is electrically coupled to system bus 38. Logic block 24c is electrically coupled to interrupt request input 31c through request path 48c. Logic block 24c is electrically coupled to inputs 32 through logic block input path 52c and to outputs 34 through logic block output path 54c. In addition, logic block 24c is electrically coupled to system bus 38. Logic blocks 24a–24c issue interrupts to interrupt request inputs 31a–31c and interrupt controller 31 through request paths 48a–48c.

Control circuit 22 is electrically coupled to interrupt controller 31, inputs 32, outputs 34 and system bus 38. Control circuit 22 is electrically coupled to interrupt controller 31 through interrupt/data path 40. Control circuit 22 is electrically coupled to inputs 32 through input path 44 and to outputs 34 through output path 46. In addition, control circuit 22 is electrically coupled to measurement device 28 through measurement data path 42. Control circuit 22 receives an interrupt request from interrupt controller 31 through interrupt/data path 40 and the interrupt data through system bus 38. The control circuit 22 communicates through system bus 38 with memory 26, which is electrically coupled to system bus 38.

In the exemplary embodiment, configuration circuit 30 is an interrupt controller 31. The interrupt controller 31 receives interrupts from logic blocks 24a–24c through interrupt request inputs 31a–31c. The interrupt request inputs 31a–31c are prioritized, such that an interrupt received at one interrupt request input 31a–31c has a different priority than an interrupt received at another interrupt request input 31a–31c. The priority levels of the interrupt request inputs 31a–31c are programmed into the interrupt controller 31 as configuration data. During automatic operation, control circuit 22 programs interrupt controller 31 through system bus 38 with priority level configuration data. During manual operation, external circuitry programs interrupt controller 31 through inputs 32 and configuration circuit input path 56 with priority level configuration data.

Interrupt controller 31 includes an interrupt mask register and an in-service register. The interrupt mask register includes one bit for each interrupt request input 31a–31c. The interrupt mask register bits indicate whether or not an interrupt is allowed through the corresponding interrupt request inputs 31a–31c. In one embodiment, an interrupt mask register bit that is low indicates an interrupt is allowed through the corresponding interrupt request input 31a–31c and a high indicates an interrupt is not allowed through the corresponding interrupt request input 31a–31c. The interrupt mask register is programmed by control circuit 22 through system bus 38.

The in-service register includes one bit for each interrupt request input 31a–31c to indicate whether or not an interrupt from the corresponding interrupt request input 31a–31c is being serviced. The in-service register bit is set to a high to indicate an interrupt is being serviced and cleared to a low to indicate an interrupt is not being serviced. Interrupt controller 31 sets and clears the in-service register bits.

In one exemplary interrupt sequence, a logic block 24a–24c issues an interrupt by driving the corresponding interrupt request input 31a–31c from a low logic level to a high logic level. The transition from a low level to a high level is detected by interrupt controller 31 and stored in an interrupt request register. In another embodiment, an interrupt can be indicated by the logic level or a transition from a high level to a low level.

The interrupt controller 31 checks the interrupt mask register to see if the interrupt request received at the interrupt request input 31a–31c is allowed. In the event the interrupt request is not allowed, that is, in the event the corresponding interrupt mask register bit is set high, interrupt controller 31 stops processing the interrupt request. In the event the corresponding interrupt mask register bit is low, the interrupt controller 31 proceeds to check the priority level of the interrupt request input 31a–31c and interrupt request.

Interrupt controller 31 includes the priority level configuration data for interrupt request inputs 31a–31c and, thus, each interrupt request provided by logic blocks 24a–24c. The interrupt request is tagged with a priority level per the priority level configuration data. Interrupt controller 31 checks to see if any higher priority level interrupts are being serviced by checking the in-service register and using the priority level configuration data. In the event a higher priority level interrupt is being serviced, no action is taken until all higher priority level interrupts are done being serviced. In the event no higher priority level interrupts are being serviced, interrupt controller 31 provides an interrupt signal to control circuit 22 through interrupt/data path 40. The interrupt signal can be a logic level or a transition from one logic level to a second logic level. In the exemplary embodiment, the interrupt signal is a transition from a low level to a high level.

Control circuit 22 returns an acknowledgement signal to interrupt controller 31 through system bus 38. In response to the acknowledgement signal, interrupt controller 31 sends an interrupt byte to control circuit 22. The interrupt byte indicates the logic block 24a–24c that produced the interrupt and needs servicing. In addition, interrupt controller 31 sets the in-service register bit for the corresponding interrupt request input 31a–31c and clears the interrupt request register bit to indicate that the interrupt is actively being serviced.

Control circuit 22 interrupts current processing to service the received interrupt. Control circuit 22 stores current processing registers and flags, and calls an appropriate interrupt handling routine. At the end of processing the interrupt handler, control circuit 22 and the interrupt handler provide an end of interrupt signal to interrupt controller 31. In response to the end of interrupt signal, interrupt controller 31 clears the in-service register, which clears the way for the next interrupt or a lower priority level interrupt to be serviced. Control circuit 22 restores registers and flags to continue processing.

Figure 4:
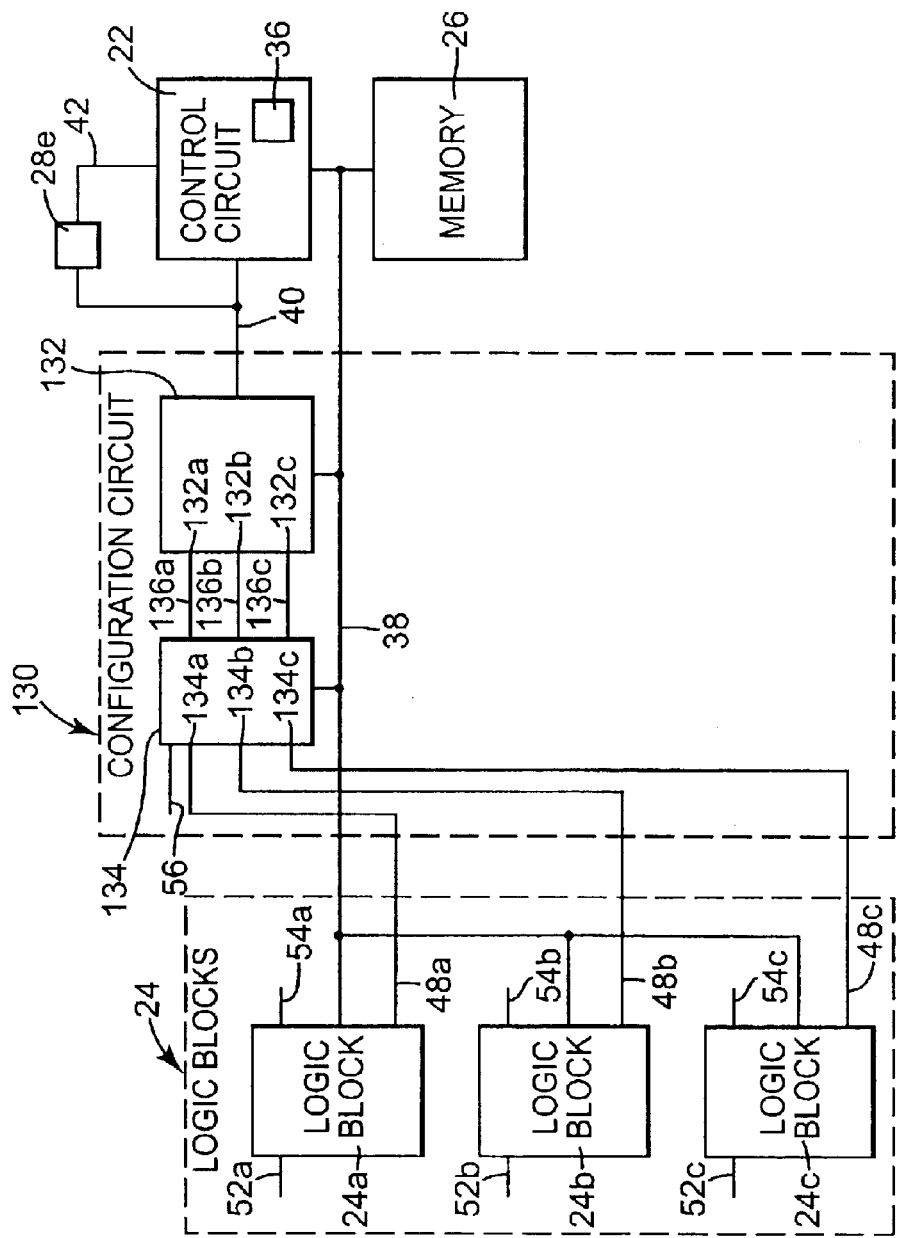
FIG. 4 is a diagram illustrating another embodiment of a configuration circuit and a measurement device with logic blocks, a control circuit and memory.

FIG. 4 is a diagram illustrating another embodiment of a configuration circuit 130 and a measurement device 28e with the logic blocks 24, control circuit 22 and memory 26. The configuration circuit 130 includes a DMA controller 132 and DMA configuration logic 134. The logic blocks, indicated at 24, include logic blocks 24a–24c.

The DMA configuration logic 134 receives DMA requests from logic blocks 24a–24c. Each DMA request is a request from a logic block 24a–24c to transfer data between the requesting logic block 24a–24c and memory 26. The DMA configuration logic 134 arranges the received DMA requests according to an arbitration scheme to process the received DMA requests in a particular order. In one arbitration scheme, the DMA requests are organized according to priority levels. The priority levels for DMA requests are programmed into DMA configuration logic 134. In other arbitration schemes, the priority levels are set according to a dynamic priority level pattern, such as round robin and random patterns. A dynamic priority level pattern is chosen for use by programming the DMA configuration logic 134. In the exemplary embodiment, the DMA configuration logic 134 assigns a priority level to each DMA request. The priority levels are configuration data programmed into DMA configuration logic 134 by control circuit 22 or through inputs 32. The DMA configuration logic 134 prioritizes the received DMA requests and passes on the highest priority level DMA request to DMA controller 132.

DMA controller 132 receives the DMA request from DMA configuration logic 134 and requests control of system bus 38 from control circuit 22. After control circuit 22 grants the system bus request, DMA controller 132 takes control of system bus 38 to transfer data between the requesting logic block 24a–24c and memory 26. The number of transfers performed and memory locations addressed are programmed into DMA controller 132 for each DMA channel, and in this situation, each logic block 24a–24c. The DMA controller 132 is programmed by control circuit 22.

In another embodiment, the system bus 38, includes a backplane controller and backplane configuration logic. The backplane controller and the backplane configuration logic operate as a configuration circuit. The backplane controller controls traffic on the system bus 38, including traffic such as DMA transfers between logic blocks and other data transfers. The backplane configuration logic receives DMA data transfer requests and arbitrates the requests in an arbitration scheme. The arbitration scheme can be any suitable arbitration scheme, including programmed priority levels and dynamic priority level schemes, such as round robin and random schemes.

In the exemplary embodiment, DMA controller 132 is electrically coupled to DMA configuration logic 134, control circuit 22, measurement device 28e and system bus 38. The DMA controller 132 is electrically coupled to control circuit 22 and measurement device 28e through interrupt/data path 40. The DMA controller 132 is electrically coupled to DMA configuration logic 134 through DMA requests paths 136a–136c. The DMA request paths 136a–136c are electrically coupled to corresponding DMA channel request inputs 132a–132c.

Each DMA channel request input 132a–132c corresponds to one DMA channel in DMA controller 132. The DMA channels are programmed by control circuit 22. The DMA channels are assigned an internal priority level inside DMA controller 132. In the exemplary embodiment, the DMA channel corresponding to input 132a has the highest priority level, followed by the DMA channel corresponding to input 132b and the DMA channel corresponding to input 132c with the lowest priority level. In other embodiments, the DMA channels can have different relative priority levels or priority levels can be assigned on a rotating basis, such as the last used DMA channel being given the lowest priority level and the priority levels of other channels being moved up one priority level.

DMA configuration logic 134 manages the DMA requests from logic blocks 24a–24c. The DMA configuration logic 134 prioritizes the received DMA requests according to programmed priority level configuration data and provides the highest priority level DMA request (as ascertained from the configuration data) to inputs 132a–132c and DMA controller 132. The actual order of execution for DMA requests is determined by DMA configuration logic 134 prior to issuing a request on inputs 132a–132c to DMA controller 132.

DMA configuration logic 134 is electrically coupled to DMA controller 132, logic blocks 24a–24c, inputs 32 and system bus 38. The DMA configuration logic 134 is electrically coupled to DMA controller 132 through DMA request paths 136a–136c. The DMA configuration logic 134 is electrically coupled to logic blocks 24a–24c through request paths 48a–48c. Logic block 24a is electrically coupled to DMA configuration logic input 134a through request path 48a. Logic block 24b is electrically coupled to DMA configuration logic input 134b through request path 48b and logic block 24c is electrically coupled to DMA configuration logic input 134c through request path 48c. In addition, DMA configuration logic 134 is electrically coupled to inputs 32 through configuration circuit input path 56.

The logic blocks 24a–24c issue DMA requests through request paths 48a–48c to DMA configuration logic inputs 134a–134c. The DMA configuration logic 134 prioritizes the received DMA requests based on the programmed priority level configuration data for each DMA configuration logic input 134a–134c and the logic block 24a–24c.

Logic blocks 24a–24c are electrically coupled to DMA configuration logic 134, inputs 32, outputs 34 and system bus 38. Logic block 24a is electrically coupled to DMA configuration logic input 134a through request path 48a. Logic block 24b is electrically coupled to DMA configuration logic input 134b through request path 48b and logic block 24c is electrically coupled to DMA configuration logic input 134c through request path 48c. The logic blocks 24a–24c are electrically coupled to inputs 32 through logic block input paths 52a–52c and to outputs 34 through logic block output paths 54a–54c. In addition, logic blocks 24a–24c are electrically coupled to elements on system bus 38, such as memory 26, which is electrically coupled to system bus 38.

Control circuit 22 is electrically coupled to DMA controller 132, measurement device 28e and system bus 38. Control circuit 22 is electrically coupled to DMA controller 132 and measurement device 28e through interrupt/data path 40. In addition, control circuit 22 is electrically coupled to measurement device 28e through measurement/data path 42.

In one type of DMA transfer, control circuit 22 receives interrupts from DMA controller 132 through interrupt/data path 40. In response to an interrupt, control circuit 22 communicates with DMA controller 132 through the interrupt/data path 40 and programs DMA controller 132 with the next set of memory addresses for continuing a DMA transfer. The interrupt and programming sequence is especially useful where memory addresses for a DMA transfer are not continuous or where the memory addresses extend over a page or block limit of the addressing scheme in DMA controller 132.

In the exemplary embodiment, the timing of the interrupt from DMA controller 132 is programmable, such that the interrupt is provided before DMA controller 132 has completed transferring data to all current addresses, and needs the next set of addresses. Providing the interrupt before DMA controller 132 needs the new addresses, gives control circuit 22 time to respond to the interrupt and program the next set of addresses before DMA controller 132 runs out of addresses and must wait. The timing of the interrupt is adjusted to ensure a non-interrupted data stream between the requesting logic block 24a–24c and memory 26. The interrupt timing for DMA controller 132 is programmed by control circuit 22 as configuration data, which is obtained from measurement device 28e.

Measurement device 28e is a gated counter electrically coupled to interrupt/data path 40 and to control circuit 22 through measurement/data path 42. The gated counter measurement device 28e includes gating logic and a counter. Measurement device 28e receives the interrupt signal and clears the counter to begin a gated period. A continuous clock signal clocks the counter to increment the counter during the gated period. The control circuit 22 responds to the interrupt by programming DMA controller 132. The control circuit 22 signals measurement device 28e to stop counting as it programs DMA controller 132. The interrupt latency count is retrieved by control circuit 22 from measurement device 28e and used to program the interrupt timing of DMA controller 132. Programming the interrupt timing ensures a non-interrupted DMA transfer data stream.

In the exemplary embodiment, configuration circuit 130 includes DMA controller 132 and DMA configuration logic 134. The DMA configuration logic 134 includes priority level registers that store priority level configuration data. DMA configuration logic 134 receives DMA requests from logic blocks 24a–24c and assigns a priority level to each received DMA request. During automatic operation, the priority level registers are programmed with configuration data from control circuit 22. During manual operation, the priority level registers are programmed with configuration data from external circuitry through inputs 32. The DMA configuration logic 134 provides prioritized DMA requests to DMA controller 132.

DMA configuration logic 134 includes a DMA request mask register for masking out DMA requests. The DMA request mask register includes one bit for each DMA configuration logic input 134a–134c. The DMA request mask register bits indicate whether or not a DMA request is allowed through the corresponding DMA configuration logic input 134a–134c. In one embodiment, a DMA request mask register bit that is low indicates a DMA request is allowed through the corresponding DMA configuration logic input 134a–134c and a high indicates a DMA request is not allowed through the corresponding DMA configuration logic input 134a–134c. The DMA request mask register is programmed by control circuit 22 through system bus 38.

DMA configuration logic 134 also includes an in-service register to indicate that a DMA request is being serviced. The in-service register includes one bit for each DMA configuration logic input 134a–134c to indicate whether or not a DMA request from the corresponding DMA configuration logic input 134a–134c is being serviced. The in-service register bit is set to a high to indicate a DMA request is being serviced and cleared to a low to indicate a DMA request is not being serviced. DMA configuration logic 134 sets and clears the in-service register bits.

DMA controller 132 receives a DMA request through the input 132a–132c corresponding to the DMA channel programmed to transfer data between the requesting logic block 24a–24c and memory 26. The DMA controller 132 transmits a request signal to control circuit 22 through interrupt/data path 40 to request taking control of system bus 38. Control circuit 22 transmits a grant signal to DMA controller 132 through interrupt/data path 40 to grant the system bus request. After receiving the grant, DMA controller 132 takes control of system bus 38 to transfer data between the requesting logic block 24a–24c and memory 26. DMA controller 132 interrupts control circuit 22 to program DMA controller 132 with additional addresses as needed. At terminal count, when the DMA transfer is complete, DMA controller 132 passes control of system bus 38 back to control circuit 22. In addition, DMA controller 132 signals DMA configuration logic 134 that the DMA transfer is complete.

In one exemplary DMA data transfer sequence, a logic block 24a–24c issues a DMA request through the corresponding request path 48a–48c by transitioning a signal from a high level to a low level, or vice-versa. The transition is detected by DMA configuration logic 134. The DMA configuration logic 134 checks the DMA mask register to see if the DMA request is allowed. In the event the DMA request is not allowed, processing stops. In the event the DMA request is allowed, processing continues with DMA configuration logic 134 assigning the DMA request a priority level. DMA configuration logic 134 prioritizes the received DMA request with other received DMA requests and checks the in-service register to see if a DMA transfer is in progress. In the event a DMA transfer is in progress, DMA configuration logic 134 maintains and updates a prioritized list of DMA requests. In the event a DMA transfer is not in progress, DMA configuration logic 134 provides the highest priority level DMA request to DMA controller 132 on the appropriate DMA channel. DMA configuration logic 134 also sets the in-service bit for the DMA request.

DMA controller 132 receives the DMA request and begins processing the request by requesting control of system bus 38. Through a handshake with control circuit 22, DMA controller 132 takes control of system bus 38 and transfers data between the requesting logic block 24a–24c and memory 26. The DMA controller 132 interrupts control circuit 22 as needed to be programmed with additional addresses. After the DMA transfer is complete, DMA controller 132 signals control circuit 22, which takes control of system bus 38 to continue processing. DMA controller 132 also signals DMA configuration logic 134, which clears the in-service register to free DMA configuration logic 134 to provide another DMA request to control circuit 22.

Integrated circuit 20 includes control circuit 22, measurement circuit 28 and configuration circuit 30/130 to update configuration data in integrated circuit 20 and change system operation and performance. The measurement circuit 28 gathers operating parameter data and the configuration circuit 30/130 is used to change integrated circuit and system operation. The measurements and configuration changes are related.

In one measurement and configuration set, a measurement device, such as measurement device 28d, is configured to count the number of times a FIFO portion of memory 26 is written over a given period of time. This is referred to as a FIFO bandwidth measurement. Control circuit 22 retrieves the FIFO bandwidth count and based on the size of the FIFO, calculates whether or not the FIFO memory is subject to overflow or underflow. Using this information, an updated configuration is programmed into integrated circuit 20.

For example, in the event a FIFO bandwidth measurement indicates the FIFO is not being serviced frequently enough to prevent overflow, control circuit 22 programs interrupt controller 31 with priority level configuration data that raises the FIFO interrupt priority level. In another configuration adjustment, control circuit 22 programs a FIFO threshold to a different value, where the FIFO threshold is the number of FIFO registers or addresses that are used before the FIFO requests servicing. In another configuration adjustment, control circuit 22 can increase the FIFO size, or provide combinations of the above configuration adjustments.

In another measurement and configuration set, measurement device 28e measures the interrupt latency for servicing the interrupt from DMA controller 132 for programming new addresses into DMA controller 132. The interrupt latency count indicates the time it takes to service the interrupt from DMA controller 132. Control circuit 22 retrieves the interrupt latency count and programs DMA controller 132 to provide the interrupt an appropriate time before needing the addresses. This ensures the addresses are available to DMA controller 132, such that DMA controller 132 does not need to stop and wait for the addresses to be programmed. Providing the addresses in a timely fashion ensures a non-interrupted data stream during a DMA transfer.

In another measurement and configuration set, measurement device 28c measures the bus hold off time of logic block 24c. Where the bus hold off time of logic block 24c exceeds a predetermined threshold value stored in non-volatile memory 36, control circuit 22 adjusts the interrupt priority levels in interrupt controller 31 for all logic blocks 24a–24c. Control circuit 22 programs the interrupt controller 31 to raise the priority level of interrupts from logic block 24c relative to logic blocks 24a and 24b. By raising the priority level of logic block 24c, more data is provided to logic block 24c and the bus hold off time is reduced to improve system operation.

In another measurement and configuration set, measurement device 28d measures the bandwidth of system bus 38. Control circuit 22 retrieves the bandwidth of system bus 38 and in one configuration, alters the clock speed of integrated circuit 20 to achieve a predetermined system bus 38 usage level. In another embodiment, control circuit 22 reduces the clock speed to reduce power consumption. In this embodiment, the clock speed is reduced to reduce power consumption while still being able to meet system bandwidth needs.

In another measurement and configuration set, measurement device 28d is configured to measure bus traffic into and out of memory 26 and record the number of consecutive addresses addressed in memory 26. Control circuit 22 retrieves the bandwidth data and consecutive addressing data and evaluates the data to see if the burst length for accessing memory 26 needs to be changed. For example, if the current burst length is four but it is found through analysis that most accesses involve eight consecutive addresses, then the burst length can be increased to eight. To accomplish this, control circuit 22 configures logic blocks 24a–24c and other devices on system bus 38, and the bus protocol to a burst length of eight. In another measurement and configuration set, measurement device 28d is configured to measure bandwidth operating parameters, such as bus traffic into and out of a logic block 24a–24c. The measurement device 28d measures the byte length of data transfers. Control circuit 22 retrieves the bandwidth data and data transfer numbers, and evaluates the data to adjust the burst length.

In another measurement and configuration set, measurement device 28a measures the bandwidth of logic block 24a and measurement device 24d measures the bandwidth of system bus 38. Control circuit 22 retrieves the two bandwidth measurements and calculates the ratio of the logic block 24a bandwidth to the system bus 38 bandwidth. The calculated ratio is compared to a predetermined threshold range. To adjust the calculated ratio, control circuit 22 programs the priority levels in interrupt controller 31 to raise or lower bus traffic into and out of logic block 24a. In another embodiment, control circuit 22 programs the DMA request priority level of logic block 24a in DMA configuration logic 134 to raise or lower DMA request priorities for DMA transfers between logic block 24a and memory 26.

In another measurement and configuration set, measurement device 28b measures the interrupt latency for logic block 24b. Control circuit 22 retrieves the measured interrupt latency count and configures the interrupt priority levels in interrupt controller 31. In another measurement and configuration set, measurement device 28b measures the DMA request latency of logic block 24b. Control circuit 22 retrieves the measured DMA request latency and in response configures the DMA request priority levels in DMA configuration logic 134.

Integrated circuit 20 includes measurement devices to take measurements and configuration circuits to change the configuration and operation of integrated circuit 20. In other embodiments, any number of measurement devices and configuration circuits can be included. Also, any number of measurements can be combined in an analysis or evaluation, such as comparing multiple counts to threshold values or comparing ratios to threshold ranges to obtain configuration data. The configuration data includes priority levels for interrupt and DMA requests, adjusting clock speeds and adjusting FIFO thresholds and memory sizes. In other embodiments, different suitable parameters can be adjusted.

Integrated circuit 20 measures operating parameters while the integrated circuit 20 is installed in a particular system and while each system function is performed. Real time operating parameter data is retrieved to be used for evaluation and to change system operation. During manual operation, integrated circuit 20 is configured by obtaining the operating parameter data from the integrated circuit 20 and evaluating the obtained data in an external system, such as a test system. The integrated circuit 20 is configured with updated configuration data, such as priority levels, through inputs 32 from the external system. During automatic operation, the operating parameter data is obtained while the system operates and control circuit 22 evaluates the operating parameter data to obtain configuration data. Control circuit 22 automatically programs configuration circuits, such as configuration circuits 30 and 130, to improve the performance of integrated circuit 20 and system operation. The flexibility and adaptability of integrated circuit 20 makes it suitable for use in a variety of systems, which raises the volume of integrated circuits 20 produced and lowers per circuit cost.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An integrated circuit, comprising:
   logic blocks;
   a measurement circuit configured to measure operating parameters of the integrated circuit and the logic blocks, and provide at least one data transfer rate parameter; and
   a control circuit configured to receive the at least one data transfer rate parameter, evaluate the at least one data transfer rate parameter to obtain configuration data and configure the integrated circuit with the configuration data.

2. The integrated circuit of claim 1, comprising a configuration circuit configured by the control circuit with the configuration data.

3. The integrated circuit of claim 2, wherein the configuration circuit comprises an interrupt controller.

4. The integrated circuit of claim 2, wherein the configuration circuit comprises a DMA controller and DMA configuration logic.

5. The integrated circuit of claim 2, wherein the configuration circuit comprises a backplane controller and backplane configuration logic.

6. The integrated circuit of claim 1, wherein the control circuit is configured to program the integrated circuit with configuration data for an arbitration scheme.

7. The integrated circuit of claim 1, wherein and the control circuit is configured to adjust data transfer timing in the integrated circuit based at least in part on the measured data transfer rate parameter.

8. The integrated circuit of claim 7, wherein the data transfer rate parameter is chosen from a list comprising interrupt latency, DMA request latency, bandwidth and bus hold off time.

9. The integrated circuit of claim 1, wherein the measurement circuit is configured to measure a bandwidth operating parameter on a FIFO memory and the control circuit is configured to adjust at least one chosen from a list comprising a FIFO memory priority level, a FIFO threshold and FIFO memory size.

10. The integrated circuit of claim 1, comprising a DMA controller, wherein the measurement circuit is configured to measure interrupt latency of an interrupt from the DMA controller to the control circuit and the control circuit is configured to adjust the timing of the interrupt from the DMA controller.

11. The integrated circuit of claim 1, wherein the measurement circuit is configured to measure continuous addresses accessed in a memory and the control circuit is configured to adjust a burst length.

12. The integrated circuit of claim 1, wherein the measurement circuit is configured to measure a bandwidth of one of the logic blocks and the control circuit is configured to adjust a burst length of the logic block.

13. The integrated circuit of claim 1, wherein the measurement circuit is configured to measure a bandwidth operating parameter and the control circuit is configured to adjust clock speed based at least partly on the measured bandwidth operating parameter.

14. An integrated circuit, comprising:
    a measurement device configured to measure an internal operating parameter of the integrated circuit and provide at least one data transfer rate parameter;
    a control circuit configured to receive the at least one data transfer rate parameter, evaluate the at least one data transfer rate parameter to obtain configuration data and provide the configuration data; and
    a configuration circuit configured to receive the configuration data to configure the integrated circuit.

15. The integrated circuit of claim 14, wherein the configuration circuit is chosen from a list comprising an interrupt controller, a DMA controller and DMA configuration logic, and a backplane controller and backplane configuration logic.

16. The integrated circuit of claim 14, wherein the control circuit is configured to program the configuration circuit with priority level configuration data.

17. The integrated circuit of claim 14, wherein the measurement circuit is configured to measure a data transfer rate parameter and the control circuit is configured to provide priority level configuration data to the configuration circuit.

18. A method of configuring an integrated circuit, comprising:
    measuring an internal operating parameter of the integrated circuit to obtain at least one data transfer rate parameter;
    providing the at least one data transfer rate parameter to a control circuit;
    receiving the at least one data transfer rate parameter at the control circuit;
    evaluating the at least one data transfer rate parameter in the control circuit to obtain configuration data; and
    configuring a circuit with the configuration data.

19. The method of claim 18, wherein configuring the circuit comprises programming the circuit with priority level configuration data.

20. The method of claim 18, wherein configuring the circuit comprises programming the circuit with priority level configuration data.

* * * * *

UNITED STATES PATENT AND TRADEMARK OFFICE
CERTIFICATE OF CORRECTION

PATENT NO. : 7,107,362 B2  
APPLICATION NO. : 10/440634  
DATED : September 12, 2006  
INVENTOR(S) : Thomas Omega Wheless, Jr. et al.

Page 1 of 1

It is certified that error appears in the above-identified patent and that said Letters Patent is hereby corrected as shown below:

Column 19, Line 51, Claim 7, after "wherein" delete "and";

Column 20, Line 40-42, Claim 17, after "wherein" delete "the measurement circuit is configured to measure a data transfer rate parameter and".

Signed and Sealed this  
Twenty-sixth Day of June, 2012

David J. Kappos  
*Director of the United States Patent and Trademark Office*